United States Patent
Khan et al.

[11] Patent Number: 6,015,759
[45] Date of Patent: Jan. 18, 2000

[54] SURFACE MODIFICATION OF SEMICONDUCTORS USING ELECTROMAGNETIC RADIATION

[75] Inventors: Ashraf R. Khan, Fremont; Sasangan Ramanathan, San Ramon; Giovanni Antonio Foggiato, Morgan Hill, all of Calif.

[73] Assignee: Quester Technology, Inc., Fremont, Calif.

[21] Appl. No.: 08/986,916

[22] Filed: Dec. 8, 1997

[51] Int. Cl.[7] .................................................. H01L 21/00
[52] U.S. Cl. ........................ 438/707; 156/345; 216/66; 438/708
[58] Field of Search .................... 438/707, 708, 438/723, 724; 156/345 V, 345 LT; 216/65, 66, 79

[56] References Cited

U.S. PATENT DOCUMENTS

| | | | |
|---|---|---|---|
| 4,320,301 | 3/1982 | Kogelschatz et al. | 422/186.18 |
| 4,385,261 | 5/1983 | Kogelschatz et al. | 315/170 |
| 4,410,495 | 10/1983 | Bässler et al. | 422/186.18 |
| 4,461,744 | 7/1984 | Erni et al. | 422/186.18 |
| 4,837,484 | 6/1989 | Eliasson et al. | 313/634 |

(List continued on next page.)

FOREIGN PATENT DOCUMENTS 0661 110 A1  7/1995  European Pat. Off. .

OTHER PUBLICATIONS

Camenzind, M., et al., Organic Compounds on Wafers, Balazs News, Balazs Analytical Laboratories, pp. 1–2.

Fujino, K., et al., Surface Modification of Base Materials for TEOS/$O_3$ Atmoshperic Pressure Chemical Vapor Deposition, J. Electrochem. Soc., vol. 139, No. 6, 1690–1692, (Jun. 1992).

Matsuura, M., et al., Substrate–Dependent Characteristics of APCVD Oxide Using TEOS and Ozone, Extended Abstract of the $22^{nd}$ (1990 International) Conference on Solid State Devices and Materials, Sendai, pp. 239–242, (1990).

Fujino, K., et al., Dependence of Deposition Characteristics on Base Materials in TEOS and Ozone CVD at Atmospheric Pressure, J. Electrochem. Soc., vol. 138, No. 2, pp. 550–554, (Feb. 1991).

Kwok, K., et al., Surface Related Phenomena in Integrated PECVD/Ozone–TEOS SACVD Processes for Sub–Half Micron Gap Fill: Electrostatic Effects, J. Electrochem. Soc., vol. 141, No. 8, pp. 2172–2177, (Aug. 1994).

Mitsubishi Electric Corporation, Clean Ozonizer.

Newman, D.S., et al, The Dielectric Barrier Discharge: A Bright Spark for Australia's Future, Aust., J. Phys., 48, pp. 543–556, (1995).

Camenzind, M., et al., How clean is your cleanroom air?, Micro Contamination Identification, Analysis, and Control, (Oct. 1995).

*Primary Examiner*—William Powell
*Attorney, Agent, or Firm*—Fliesler Dubb Meyer & Lovejoy LLP

[57] ABSTRACT

Deposition rates of undoped silicate glass dielectric layers on thermal oxide are increased by pre-treating the thermal oxide layer with electromagnetic radiation in the ultraviolet (UV) and/or vacuum ultraviolet (VUV) wavelengths. The surface smoothness of the resulting films are also increased by pre-treating films with UV and/or VUV radiation. Furthermore, the gap filling abilities of the undoped silicate glass films are increased by pre-treating the thermal oxide with UV and/or VUV radiation. New equipment and methods are presented for exposing semiconductor devices to UV and/or VUV radiation, and for enhancing the deposition rates and film quality for semiconductor manufacture. Semiconductor devices incorporating the new methods are also described.

61 Claims, 7 Drawing Sheets

U.S. PATENT DOCUMENTS

| | | | |
|---|---|---|---|
| 4,871,416 | 10/1989 | Fukuda | 438/708 |
| 4,945,290 | 7/1990 | Eliasson et al. | 315/246 |
| 4,983,881 | 1/1991 | Eliasson et al. | 313/607 |
| 5,006,758 | 4/1991 | Gellert et al. | 313/634 |
| 5,013,959 | 5/1991 | Kogelschatz | 313/36 |
| 5,051,380 | 9/1991 | Maeda et al. | 451/238 |
| 5,118,989 | 6/1992 | Egermeier et al. | 313/631 |
| 5,173,638 | 12/1992 | Eliasson et al. | 313/634 |
| 5,185,552 | 2/1993 | Suzuki et al. | 313/231.71 |
| 5,198,717 | 3/1993 | Kogelschatz et al. | 313/17 |
| 5,214,344 | 5/1993 | Kogelschatz et al. | 313/17 |
| 5,386,170 | 1/1995 | Kogelschatz et al. | 313/17 |
| 5,387,546 | 2/1995 | Maeda et al. | 437/174 |
| 5,432,398 | 7/1995 | Kogelschatz et al. | 313/25 |
| 5,470,799 | 11/1995 | Itoh et al. | 438/708 |
| 5,484,749 | 1/1996 | Maeda et al. | 437/238 |
| 5,489,553 | 2/1996 | Chen | 437/195 |
| 5,510,158 | 4/1996 | Hiramoto et al. | 427/582 |
| 5,536,681 | 7/1996 | Jang et al. | 437/19 |

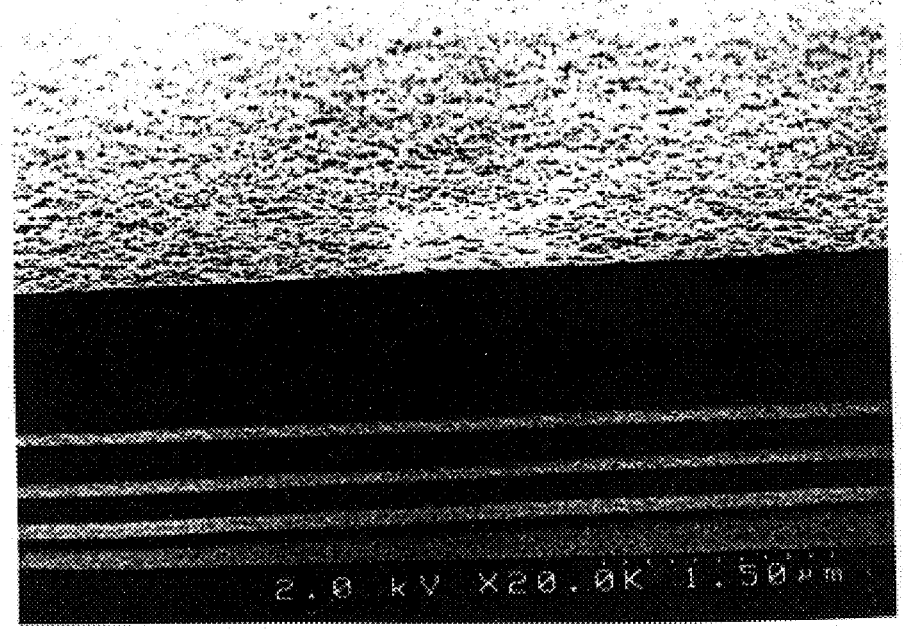
FIG.—4a
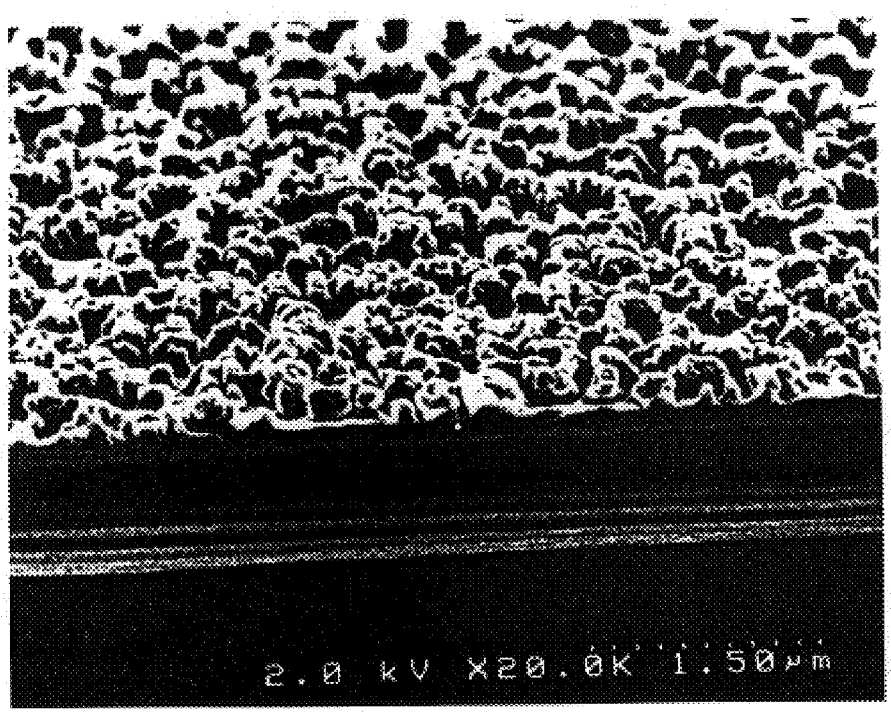
FIG.—4b

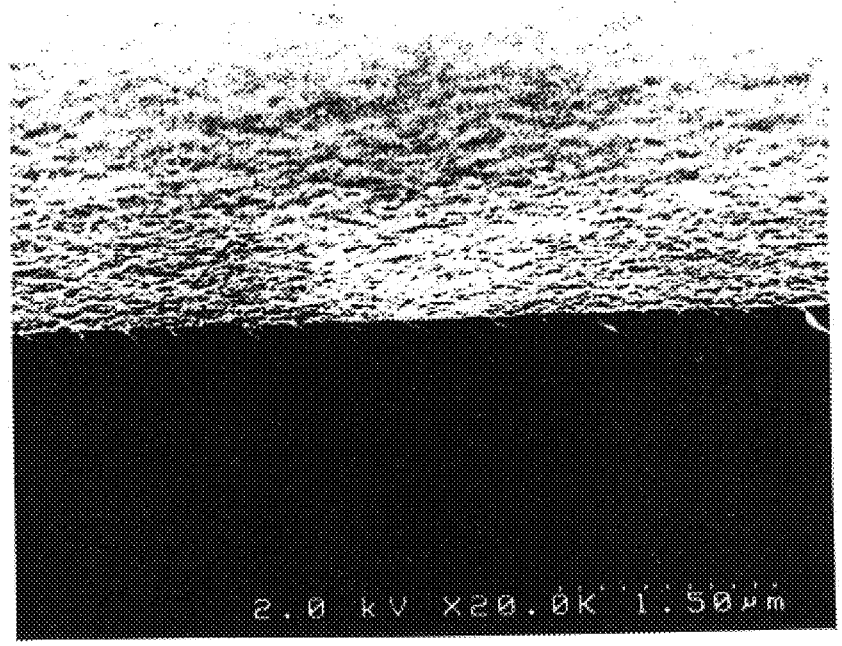
FIG.—4c
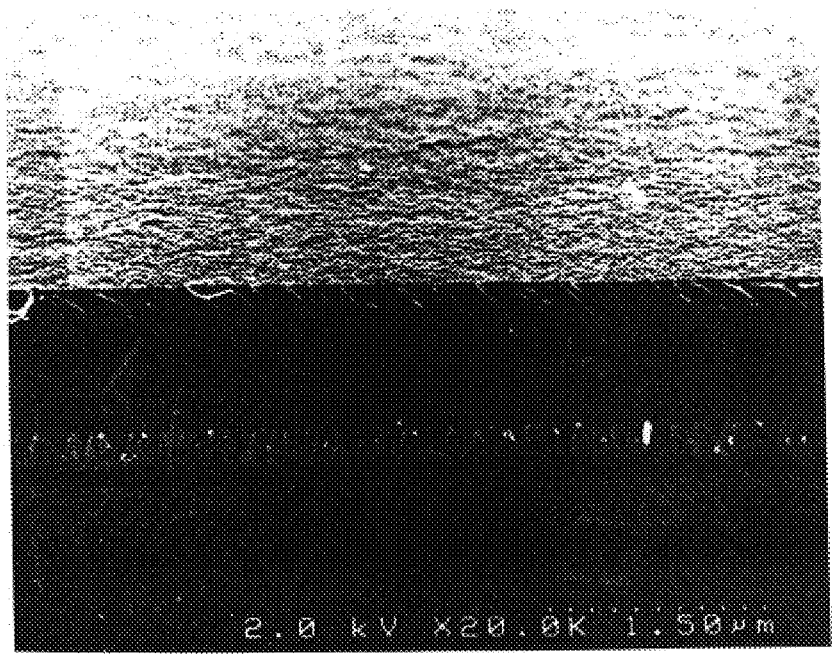
FIG.—4d

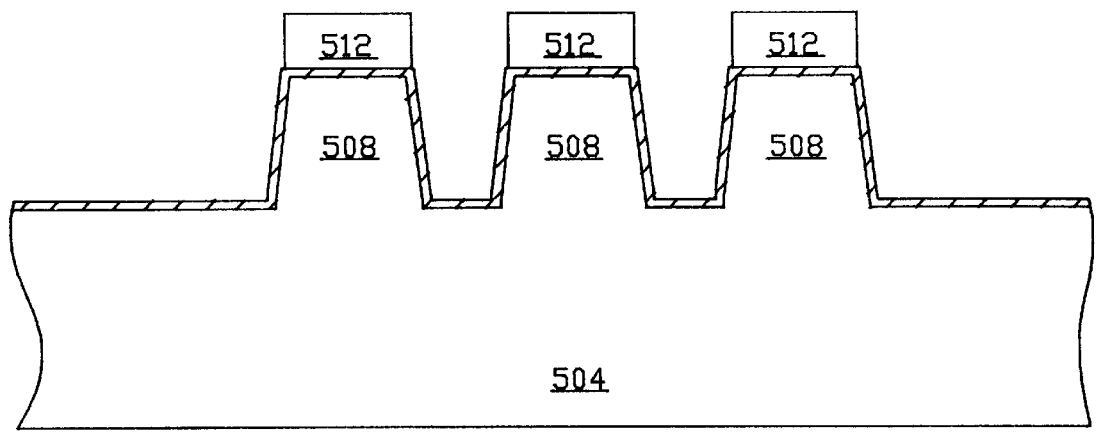
FIG.—5a
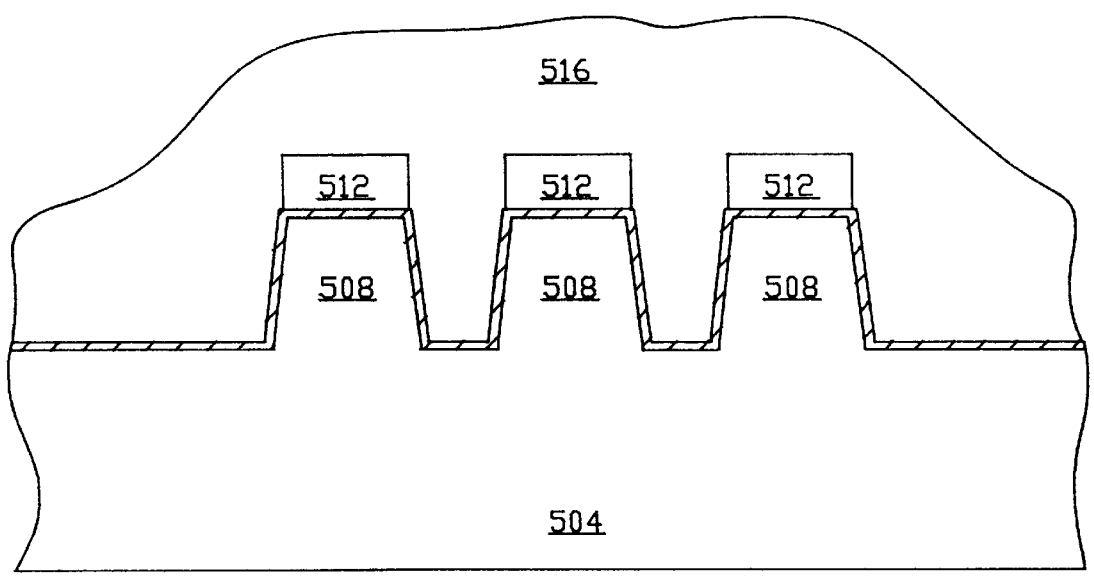
FIG.—5b

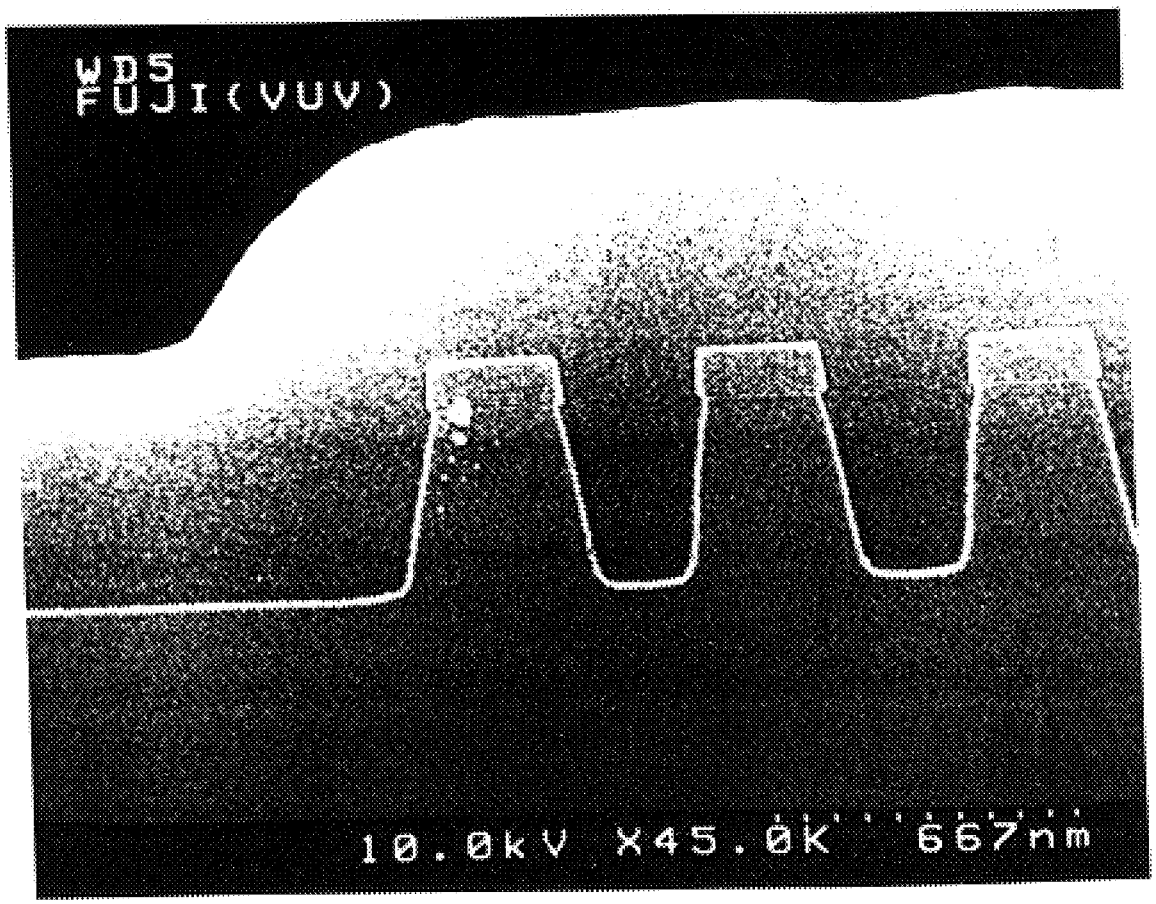
FIG.—6

SURFACE MODIFICATION OF SEMICONDUCTORS USING ELECTROMAGNETIC RADIATION

BACKGROUND OF THE INVENTION

1. Field of the Invention

The field of the invention comprises apparatus and methods for manufacturing semiconductor devices.

2. Discussion of the Related Art

For the past 20 years, the integrated circuit (IC) device density has doubled about every 18 months. As device density increases, the space between semiconductor device features must therefore decrease. However, as the space between device features decreases, the ability to electrically isolate the devices becomes more difficult. To provide the electrical isolation as well as mechanical structure to fabricate the devices, the narrow spaces are filled with silicon dioxide or other suitable insulator. To separate the devices within the silicon substrate, spaces are provided by means of shallow trenches. These trenches are filled with silicon dioxide which can be derived from the reaction of tetraethylorthosilicate (TEOS) and ozone.

The fabrication of shallow trenches is currently carried out by providing a semiconductor substrate, typically silicon wafer with a thermal oxide surface, which is manufactured by exposing a surface of silicon to an oxidizing agent such as oxygen at high temperatures to create a surface of $SiO_2$.

Similarly, polysilicon interconnect layers as well as conductive metal interconnects have spaces which are to be filled with silicon dioxide or other suitable dielectric material to insulate the conductive layers from each other. The dielectric material, such as $SiO_2$, can be made of un-doped silicate glass (USG) or non-doped silicon glass (NSG). These terms are considered to be equivalent in this application. USG is deposited using the precursors, TEOS and ozone, using a chemical vapor deposition (CVD) processing.

Conventionally deposited films of USG based on TEOS/ozone technology, however, have several drawbacks. Of these, one of the most important is the sensitivity of the deposited film to the condition of the substrate on which the film is deposited. This is termed "surface sensitivity." {See Kwok et al., *J. Electrochem. Soc.*, 141(8):2172–2177 (1994); Matsuura et al., *Proceedings of the 22$^d$ International Conference on Solid State Devices and Materials, Sendai*, pp:239–242 (1990); Fujino et al., *J. Electrochem. Soc.* 138(2):550–554 (1991); and Fujino et al., *J. Electrochem. Soc.* 139(6):1690–1692 (1992), each incorporated herein fully by reference.} Surface sensitivity is characterized by inconsistent and variable deposition rates and increased roughness of the resulting films as the process conditions are varied. The process conditions of interest are deposition temperature, deposition pressure, mole-fraction of the reactants (e.g., TEOS and ozone), and possibly some hardware conditions specific to the design of the reactor used to deposit these films.

Increasing the ozone concentration can result affect the deposition rate and increased surface roughness, as reflected both in direct measurements of surface features using scanning electron microscopy, as well as increased wet etching rates observed with aqueous HF solutions. One possible hypothesis to account for surface roughness is the nucleation mechanism, also known as an "island growth mechanism" originating on the surfaces being covered. Depending on the molecular makeup of the surface and its state, the TEOS ozone begins deposition in a granular form. As the film becomes thicker, this granular structure can be seen as surface roughness. This is in contrast with a smooth, "layered growth mechanism" which results in an even, smooth layer of deposited material.

Surface roughness introduces a number of adverse effects for processing the TEOS ozone films and films subsequently deposited on the TEOS ozone films. As photoresist is coated on the wafer surface to form holes (vias) for interconnecting conductive layers, the photoresist's surface adhesion is decreased on rough surfaces. With the exposure of the photoresist to the stepper light radiation, the granular surface introduces many reflections resulting in poor dimensional definition of the photoresist layer. During etching, the granular surface reduces adhesion with the possibility of delamination of the photoresist layer.

Additionally, as the gaps between semiconductor device features decreases, these gaps becomes increasingly more difficult to fill adequately. As the surface films increase in thickness, the corresponding film does not completely fill the gap, resulting in the formation of a "void." This is especially the case if there is surface sensitivity of deposition of materials within the gap. Films deposited at low ozone concentration exhibit conformal coating of device features, resulting in the formation of a void as the gap becomes filled.

These unfilled gaps, or "voids" can trap contaminants which can degrade the integrated circuit device, and are not effective dielectrics. The presence of voids therefore decreases device reliability of the device. However, TEOS/ozone films deposited using high ozone concentrations are known to exhibit better gap filling properties and have better in situ flow characteristics than low ozone films {Kwok et al., *J. Electrochem. Soc.* 141(8):2172–2177 (1994)}.

Surface sensitivity is observed for several types of substrates, including silicon dioxide formed either as thermal oxide, or as $SiO_2$ deposited through TEOS ozone or TEOS oxygen plasma processes (PECVD). The $SiO_2$ can be either phosphorous doped silicate glass (PSG), spin on glass (SOG), borophosphorous silicate glass (BSG), or combinations of PSG and BSG. Additionally, surface sensitivity can be a problem for dielectric layers deposited on silicon nitride ($Si_3N_4$).

Thus, the semiconductor industry is interested in decreasing the effects of surface sensitivity and ensuring good gap filling with high quality dielectric materials. However, to date the problems of surface sensitivity and poor gap filling have been not been adequately addressed.

I Surface Sensitivity

Several approaches have been used to treat semiconductor surfaces. Maeda et al. U.S. Pat. No. 5,484,749 described a process whereby semiconductor devices were exposed to heat and high frequency plasma to treat the surface of an $SiO_2$ layer prior to deposition of a TEOS ozone film. However, this process requires additional costly plasma treatment equipment.

Another approach by Maeda et al., U.S. Pat. No. 5,051,380 was to deposit the USG film discontinuously. A first layer of USG is deposited using a low ozone concentration, and then a subsequent USG film is deposited using a higher ozone concentration. However, USG films using low ozone concentration have less desirable film qualities, such as high water content and absorption, high etch rates, and shrinkage during high temperature annealing, which induces stress and formation of voids or seams. {Kwok et al., *J. Electrochem. Soc.* 141(8):2172–2177 (1994).} Furthermore, the thickness needed to overcome surface sensitivity of a low ozone USG film may be as great as 1000 Å, thus filling the gap with poor quality oxide and preventing filling the gap with high quality, high-ozone oxide. As gaps decrease to 0.25 μm, after a first layer of a low ozone USG film, only 500 Å would be available for a second layer of a effective high ozone USG material to fill the gaps.

An additional approach is to modify the surface of the USG film. Maeda et al., U.S. Pat. No. 5,387,546 taught the exposure of deposited semiconductor films to ultraviolet radiation during heating. The ultraviolet radiation was produced by a mercury lamp which generates electromagnetic radiation with wavelengths of 185 nanometers (nm) and 254 nm, as well as some longer wavelength radiation. However, because this process is carried out on layers of USG film which have already been deposited, it does not deal with the problem of surface sensitivity. Thus, there is a need for improved ways of reducing surface sensitivity.

II Gap Filling

Attempts to improve the filling of gaps include the use of nitrogen gas ($N_2$) plasma to selectively treat dielectric materials deposited over conductive lines to decrease the rate of deposition of USG films at those locations. Jang et al., U.S. Pat. No. 5,536,681. By decreasing the rate of deposition over the conductive lines, relatively more dielectric material can be deposited within the gaps, resulting in decreased formation of voids. However, this process requires at least 3 additional steps and additional equipment, is expensive, and requires additional processing time, and therefore is not efficient.

Chen, U.S. Pat. No. 5,489,553, exposed a thermal oxide layer to HF. HF is a strong acid which removes all surface silicon dioxide, exposing bare silicon for subsequent deposition of TEOS ozone silicon dioxide films. The formation of SiOF moieties on the surface resulted in improved conformal deposition of oxide; however, the introduction of fluorine atoms into the film can result in the liberation of fluoride ions which can introduce reliability problems as the fluorine ions combine with moisture to form HF. Moreover, the presence of fluorine atoms may themselves result in surface sensitivity. { See Kwok et al., *J. Electrochem. Soc.* 141:2172, incorporated herein fully by reference.}

Therefore, there is a need for improved gap filling processes which can be carried out without the introduction of harmful species into the dielectric films.

SUMMARY OF THE INVENTION

On the basis of the foregoing, one object of the invention is to provide a method for decreasing the surface sensitivity of semiconductor wafer surfaces which are covered with various films, such as, for example, dielectric films.

Another object is to decrease surface sensitivity without adversely affecting the rates of deposition of dielectric films and conductive.

Yet another object is to provide apparatus for carrying out pretreatments which eliminate or decrease surface sensitivity.

A further objective is to provide methods for improved gap filling and suitable insulation for shallow trench isolation.

Yet another object is to provide semiconductor chips incorporating dielectric layers deposited after pretreatment of the substrate to decrease surface sensitivity.

Still another object is to provide methods for the improved filling of narrow gaps resulting in fewer voids.

The invention includes apparatus and methods for pre-treating semiconductor surfaces to reduce the surface sensitivity of the film.

Therefore, one aspect of this invention is the development of methods for exposing thermal oxide substrates to electromagnetic radiation in the vacuum ultraviolet and ultraviolet wavelengths to reduce the surface sensitivity of subsequently deposited films, such as for example, dielectric films.

Another aspect of this invention is the development of methods for reducing surface sensitivity while maintaining desired rates of deposition of thin films, such as for example, dielectric films.

Yet another aspect of this invention is the development of apparatus for exposing semiconductor wafers to vacuum ultraviolet light under conditions which diminish surface sensitivity.

A further aspect of this invention is the development of apparatus for pre-treating gaps in semiconductor devices to permit improved gap filling with dielectric materials resulting in the complete filling of the gaps.

These and other features and advantages of the present invention will be apparent from the Detailed Description of the Invention in conjunction with the

BRIEF DESCRIPTION OF THE DRAWINGS

FIG. 4a is a scanning electron photomicrograph of the surface of a layer of USG deposited on top of a silicon substrate.

FIG. 4b is a scanning electron photomicrograph of the surface of a layer of undoped silicate glass deposited on top of a thermal oxide substrate.

FIG. 4c is a scanning electron photomicrograph of the surface of a layer of USG deposited on top of a thermal oxide substrate that had been pre-treated for 1 minute with vacuum ultraviolet radiation according to this invention prior to deposition of the USG.

FIG. 4d is a scanning electron photomicrograph of the surface of a layer of USG deposited on top of a thermal oxide substrate that had been pre-treated for 5 minutes with vacuum ultraviolet radiation according to this invention prior to deposition of the layer of USG.

FIGS. 5a and 5b are diagrams of a wafer with shallow trench isolation features showing complete gap filling by a TEOS ozone silicon dioxide dielectric after pre-treating the wafer with electromagnetic radiation.

FIG. 6 is an electron photomicrograph of a semiconductor device showing the gap filling properties of USG after pretreatment of a thermal oxide substrate with vacuum ultraviolet radiation in accordance with this invention prior to deposition of the layer of USG.

Figure 1:
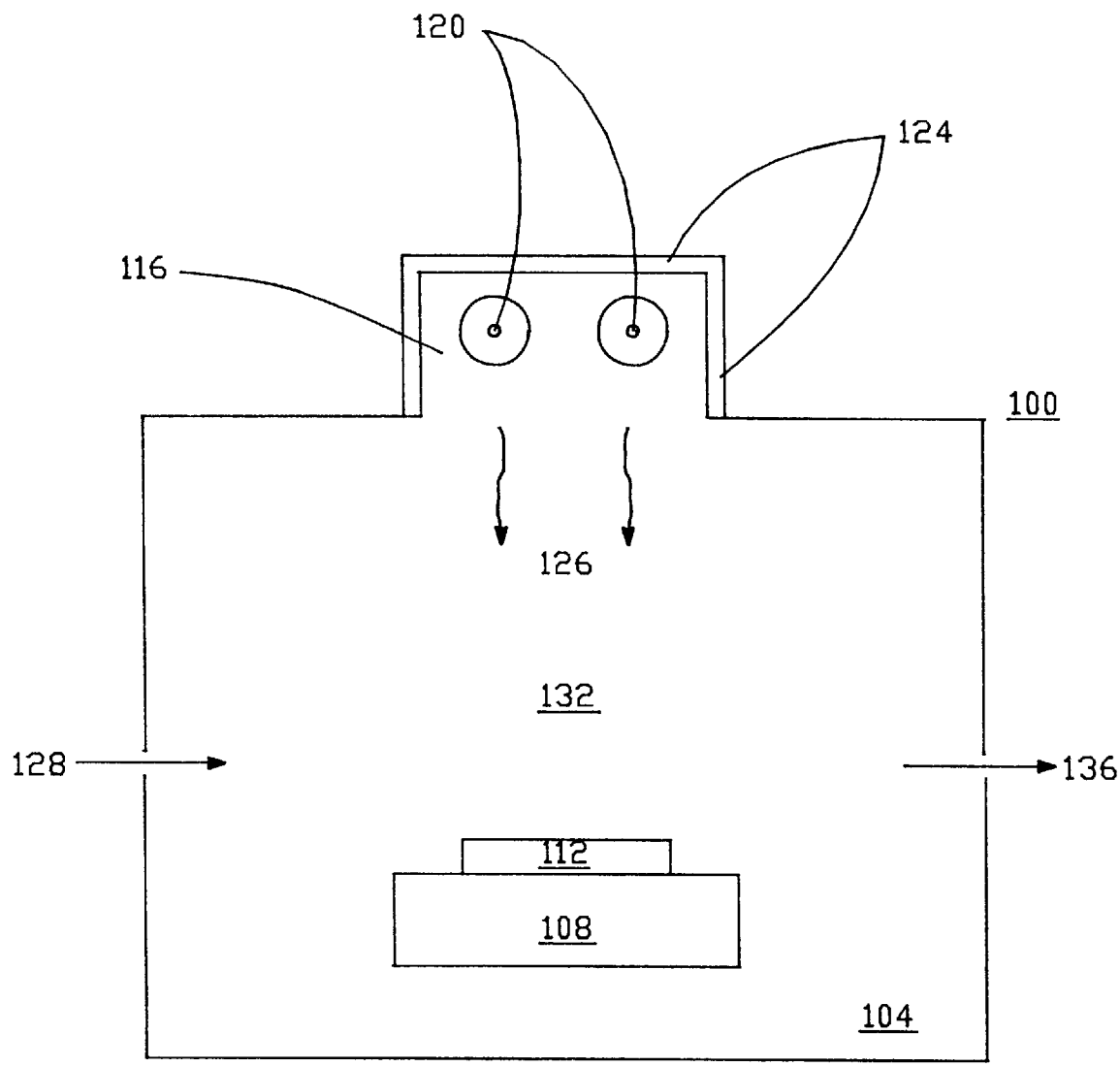
FIG. 1 is a depiction of an embodiment of the invention for exposing semiconductor wafers to electromagnetic radiation derived from a dielectric barrier discharge device.

The Figures are more thoroughly explained in the Detailed Description of the Invention.

DETAILED DESCRIPTION OF THE INVENTION

I Methods of Minimizing Substrate Surface Sensitivity

The present invention comprises methods and apparatus for pre-treating semiconductor substrates with electromagnetic radiation of preferably vacuum ultraviolet and ultraviolet wavelengths prior to the deposition of semiconductor layers, preferably dielectric layers. This pretreatment substantially reduces the surface sensitivity of the deposition process so that thermal oxide surfaces can have layers of dielectric material deposited thereon at higher rates and with surface smoothness nearly identical to the surface smoothness of dielectric materials deposited on bare silicon. Moreover, the quality of the USG film is high, providing better dielectric properties and permitting effective electrical insulation and the filling of gaps in the 0.25 $\mu$m range.

This invention is rooted in the recognition that surface sensitivity is determined by the nature of the substrate surface. The nature of the surface is determined at least partially by the atomic and molecular species and how they are bonded together on the substrate surface. The substrate material, the methods by which it is prepared, and the ambient conditions to which it is exposed prior to dielectric deposition, are factors that influence the nature of the surface and the quality of the subsequently deposited film.

There are several theories which may account for surface sensitivity. One theory is that surface sensitivity is related to the wetting behavior of the substrate. A pure silicon surface is hydrophobic, (that is, it repels water), whereas thermal oxide, made by exposing a silicon surface to oxygen at elevated temperatures, is hydrophilic, (that is, water wets the surface). This theory therefore states that the surface sensitivity is related to the hydrophilicity of the substrate.

A second theory relates to the electrostatic interaction between the substrate surface and the deposited species. {Kwok et al., *J. Electrochem. Soc.* 141(8):2172–2177 (1994), incorporated herein fully by reference.} It is observed that even on silicon wafers, USG deposited with high ozone concentrations shows surface sensitivity if fluorine atoms are present instead of hydrogen. The deposition of TEOS and ozone takes place through the formation of an intermediate species, hypothesized to be electronegative, in the gas phase. Because fluorine is extremely electronegative, this gas phase intermediate may be repelled by fluorine atoms on the surface. This results in low deposition rates and uneven deposition. According to this theory, unlike fluorine atoms, hydrogen atoms are not very electronegative, so deposition of intermediates on substrates free of fluorine is more rapid and more even.

A third theory relates to the presence of undesirable types of silicon bonds on the surface. For example, the thermal oxide surface is expected to have Si—O—Si, Si—H, and Si—OH bonds on the surface along with some hydrocarbon or other organic contaminants. According to this theory, the presence of these types of bonds decreases the homogeneity of the resulting film, thereby causing it to have a rough surface. According to this theory, these bonds may form when contaminants on the surface bind to the silicon or oxygen atoms in the $SiO_2$ film.

A fourth theory relates to the presence of organic contaminants on the substrate surface. Typical sources of organic contamination are clean room air and the photoresist residue from photolithography processes. The organic moieties found include silicon carbide, amides, silicones, organophosphorous compounds, $C_6$–$C_{28}$ aliphatic or aromatic hydrocarbons, phthalates, alcohols (e.g., isopropyl alcohol), N-methyl pyrrolidone, creosols and amines. Camenzind et al., *Balazs News*, Number 20: 1–3 (October 1997); and Camenzind et al., *MICRO* pp: 71–76 (October 1995), incorporated herein fully by reference.

These theories are included only for descriptive purposes, and the present invention does not rely upon any particular of these theories for its operability. Furthermore, other theories may account for surface sensitivity. Regardless of the molecular source or mechanism responsible for surface sensitivity, the present invention uses electromagnetic radiation preferably in the ultraviolet and vacuum ultraviolet ranges to prepare the surface prior to deposition of the layer, preferably a dielectric layer.

According to some theories, surface modification requires the breaking of undesirable bonds and/or the formation of desirable surface bonds or surface sites. These bonds include Si—OH, Si—C, Si—N, among others. The bond energies of some relevant bonds are shown in Table 1. These energies lie in the visible, ultraviolet (UV) and vacuum ultraviolet (VUV) range, and therefore electromagnetic radiation of these wavelengths will interact with these bonds. Therefore, it is possible to modify the bonding state of the thermal oxide surface by exposing this surface to UV or VUV radiation.

TABLE 1

Bond Energies For Selected Bonds

| Bond | Energy (eV) | Wavelength (nm) |
|------|-------------|-----------------|
| H—H  | 4.52        | 274             |
| C—C  | 3.60        | 344             |
| Si—Si| 1.83        | 678             |
| N—N  | 1.67        | 745             |
| O—O  | 1.44        | 861             |
| C—H  | 4.28        | 289             |
| Si—H | 3.05        | 406             |
| N—H  | 4.05        | 306             |
| O—H  | 4.80        | 259             |
| C—Si | 3.01        | 413             |
| C—N  | 3.02        | 410             |
| C—O  | 3.64        | 340             |
| Si—O | 3.82        | 324             |
| C=C  | 6.34        | 195             |
| C≡C  | 9.22        | 134             |

Data from L. Pauling, *The Nature of the Chemical Bond and the Structure of Molecules and Crystals: An Introduction to Modern Structural Chemistry*, Third Edition, Cornell University Press, Ithaca, N.Y., 1960; and Atkins, *Physical Chemistry*, 3d Edition, Oxford University Press (1988), incorporated herein fully by reference.

As can be seen from Table 1, certain bonds can absorb electromagnetic radiation and thereby be disrupted. With the dissociation of these undesirable bonds, the contaminating moieties can be removed from the surface. The electromagnetic radiation has sufficient energy to break the bonds, thereby allowing removal of the moieties from the surface.

II Types Of Electromagnetic Radiation Emitting Devices

Mercury-vapor lamps, hydrogen lamps, lasers, and the dielectric barrier discharge lamps including excimer radiation devices are a few different devices useful for obtaining the UV and VUV radiation of this invention. With recent advances in dielectric barrier discharge technology, it is now possible to make UV and VUV lamps that can provide reasonably high intensity monochromatic radiation over a large surface area. These types of lamps are therefore suitable for practicing this invention. However, because it is possible to use any source of UV and VUV radiation, some aspects of the invention are not limited to any particular source of radiation.

Excimer devices are characterized by the use as emitter moieties, atoms which under normal temperatures and other conditions do not form chemical bonds between them. For example, noble gases normally do not form interatomic bonds. However, under high energy conditions, noble gases can form dimers. When these dimers break down, the energy of the bonds is released as high energy electromagnetic radiation. Depending on what the excimer gas is, the wavelength of the emitted radiation may be in the ultraviolet or vacuum ultraviolet range.

The bonds shown in Table 1 correspond to energies in the UV and VUV ranges. Several types of devices are capable of generating electromagnetic radiation in the wavelength ranges needed. VUV or UV radiation can be provided by dielectric barrier or silent discharge equipment using a variety of gases or gas mixtures according to methods known in the art. VUV and UV radiation can be generated from noble gases and other atomic species (see Table 2).

TABLE 2

Emission Wavelengths For Selected Electromagnetic Radiation Emitters

| Emitter Moiety | Wavelength (nanometers) |
| --- | --- |
| $He_2$ | 60–100 |
| $Ne_2$ | 80–90 |
| $Ar_2$ | 107–165 |
| $Kr_2$ | 140–160 |
| $Xe_2$ | 160–190 |
| $N_2$ | 337–415 |
| KrF | 240–255 |
| Hg/Ar | 235 |
| Deuterium | 150–250 |
| XeF | 340–360, 400–550 |
| XeCl | 300–320 |
| XeI | 240–260 |
| ArF | 180–200 |
| ArCl | 165–190 |
| ArCl/KrCl | 165–190, 200–240 |
| KrCl | 200–240 |
| Hg | 185, 254, 320–370, 390–420 |
| Se | 196, 204, 206 |

Data from Eliasson et al., U.S. Pat. No. 4,983,881 and Kogelschatz, U.S. Pat. No. 5,432,398, incorporated herein fully by reference.

These ranges of wavelengths encompass the wavelengths equivalent to the energy of the undesired bonds on the substrate surface. Although the wavelengths above are those exhibiting the maximum power, there is a bandwidth of the wavelengths generated by each of the above emitter moieties. The bandwidths vary from about 1 to about 17 nm. {Newman et al., Aust. J. Phys. 48:543–556 (1995), incorporated herein fully by reference.} Thus, these emitters can be used to expose the surface of a semiconductor substrate to a spectrum of electromagnetic radiation, thereby increasing the number and types of chemical bonds which may be dissociated.

A Dielectric Barrier or Silent Discharge Lamps

Dielectric barrier discharge devices, also known as silent discharge devices, consist of two conductive plates, each covered with a dielectric layer and are separated from each other by an emitter gas-containing gap. Examples of such emitter gases are shown in Table 2. The dielectric barrier decreases the conduction through the gap, and therefore, the generation of current flow between the plates requires a higher voltage. When the voltage is sufficient to overcome the resistance of the dielectric materials, the resulting current through the gas is substantially higher than without the dielectric layer, and consequently, more power is delivered to the gas. When the dielectric breakdown occurs, small microplasmas are formed across the gap. The current excites the gas and the resulting photons emitted are in the desired VUV and UV ranges, depending on which atomic species are present in the gas. In the excimer process, the microplasmas deliver the energy to the gases inducing the formation of dimers. As these dimers dissociate, the excimer radiation is emitted. When emitted within the exposure chamber, these photons are directed at the surface of the wafer, and interact with molecules on the surface, decreasing the surface sensitivity to subsequently deposited USG films.

A subset of useful lamps include dielectric barrier excimer lamps. Excimer lamps are known in the art, and are exemplified by the devices described in Kogelschatz, U.S. Pat. No. 5,432,398; Kogelschatz, U.S. Pat. No. 5,386,170; Eliasson et al., U.S. Pat. No. 4,837,484; Eliasson et al., U.S. Pat. No. 4,945,290; Eliasson et al., U.S. Pat. No. 4,983,881; Gellert et al., U.S. Pat. No. 5,006,758; Kogelschatz et al., U.S. Pat. No. 5,198,717; Kogelschatz, U.S. Pat. No. 5,214,344; and Kogelschatz, U.S. Pat. No. 5,386,170. Each of the aforementioned references in herein incorporated fully by reference.

Any suitable lamp is useful for practicing the method of this invention. These devices comprise a central electrode surrounded by a quartz dielectric. Surrounding the quartz dielectric is a chamber containing the emitter gas, such as Xe or those exemplified by Table 2. Surrounding the chamber containing the emitter gas, another dielectric shield, transparent to the UV or VUV wavelengths generated encloses the gas in the tube. Suitable materials include, but are not limited to quartz, LiF, $MgF_2$, or $CaF_2$. An outer electrode, commonly of mesh wire, surrounds the outer dielectric layer.

Excitation of the emitter gas results in the production of electromagnetic radiation which exits the tube inside the exposure chamber. Because air in the chamber may absorb the photons preventing them from reaching the substrate surface, the exposure chamber is either evacuated or the air is replaced with a gas which does not absorb the wavelength of radiation produced by the emitter device. For a xenon excimer device, suitable gases include nitrogen, argon, helium, xenon or ammonia. For other emitter devices, non-absorbing gases are chosen accordingly to permit passage of the photons to the substrate surface.

FIG. 1 depicts apparatus 100 of the invention for pre-treating thermal oxide substrates. An exposure chamber 104 houses a chuck 108 which is capable of being heated by a heating device (not shown). The chuck 108 may be moved in any of 3 dimensions to optimize the exposure of the wafer to the radiation. It is important that radiation be evenly distributed over the surface, as variations in the surface pretreatment can result in variations in the thickness of the subsequently deposited USG film. A semiconductor wafer 112 is held on top of the chuck. A lamp 116 is disposed within the chamber 104 in any configuration which is suitable for providing even exposure of the wafer to the radiation. In this figure, the lamp 116 is shown on the top of the chamber. Suitable lamps may be any conventional emitter lamps known in the art, including, but not limited to those disclosed in U.S. Pat. Nos. 5,432,398, 5,214,344, and U.S. Pat. No. 5,198,717, incorporated herein fully by reference.

The power and exposure times are selected to minimize the surface sensitivity of the USG film deposition. The power output of the excimer lamps is in the range of from about 0.005 $W/cm^2$ to about 100 $W/cm^2$. Preferably, the power output is in the range of from about 0.1 $W/cm^2$ to about 5 $W/cm^2$, and more preferably about 1 $W/cm^2$ Exposure times can vary inversely with the power output of the generator. However, these exposure guidelines can be altered depending upon the pre-existing state of the surface. For cleaner surfaces, less power and/or shorter exposure durations are necessary.

The lamp as shown comprises two or more emitter devices 120 which are arranged so as to provide radiation exposure over the wafer surface. Reflective elements 124 reflect the emitted radiation 126 back down into chamber 104 to increase exposure of the wafer to the radiation. An inlet port 128 permits the introduction of gas 132 into the exposure chamber 104. The gas 132 is any suitable gas or mixture of gases which do not absorb the wavelengths of excimer radiation produced by lamp 120. Gases are drawn out of the chamber 104 through an exhaust port 136. Alternatively, the chamber 104 is evacuated substantially to remove air, and thereby decrease the absorption of radiation 126.

Any of several lamps are suitable for this invention. Table 3 shows some characteristics of lamps.

TABLE 3

Characteristics of UV and VUV Lamps

| Type | Power Range (Watts) | Power Density (W/cm$^2$) | Max. Radiant Power at λ (W) | λ (nm) | Max. Irridiance Power at λ (W) | λ (nm) |
|---|---|---|---|---|---|---|
| Low P Hg | 6–150 | 0.2–0.3 | 6–45 | 253.7 | 200–550 | 253.7 |
| Low P Hg, Type ABB | 1500–2000 | 10–15 | 90–500 | 253.7 | 2000–6000 | 253.7 |
| Med. P Hg | 75–60,000 | 40–300 | 1.5–3500 | 254 | 700–5000 | 254 |
| Fusion Type H | 6000 | 240 | 270 | 201–250 | 28,000 | 201–250 |
|  |  |  | 500 | 251–300 | 50,000 | 251–300 |
|  |  |  | 335 | 301–350 | 35,000 | 301–350 |
| XeCl | 10,000 | 50 | 330 | 308 | 11,700 | 308 |
| KrCl | 10,000 | 50 | 330 | 222 | 11,700 | 222 |
| Xe | 10,000 | 50 | 240 | 172 | 8500 | 172 |

Data taken from Braun et al., *Photochemical Technology*, John Wiley & Sons, New York, (1991), Oldring et al., (eds.) *Chemistry & Technology of UV & EB Formulation for Coatings, Inks, & Paints*, Vol. 1, STA Technology (1991), Heraeus Noblelight, *Product Catalogue*, Heraeus Noblelight GmbH, Hanau, Germany, each reference incorporated herein fully by reference.

B Open Emitter Process

An alternative device of this invention for exposing wafers to VUV or UV radiation involves the introduction of the emitter gas directly into the chamber and generating electromagnetic radiation within the chamber without the necessity of enclosing the source in an additional containment vessel, such as a quartz tube. This type of process is herein termed an "open emitter" process. It differs from a standard dielectric discharge device described above in that the emitter gas is not enclosed within a separate vessel, but rather, the wafer to be treated is exposed directly to the emitter gas within the chamber. The emitter gas flows into the chamber and past an array of electrodes with alternating polarity relative to their neighbors on either side. As electrical charge passes into the electrodes, electrical fields are set up between the electrodes. The electrical fields excite the gas, forming, among other species, dimers with high bond energy. The excited gas molecules can either emit the photons while above the surface, or may penetrate into the gaps in the device features, where the photon may be emitted. In this way, it is possible to ensure that some UV or VUV radiation reaches the interior of the gaps to exert the desired conditioning effects on the substrate. This embodiment also permits the use of emitter gases which generate shorter wavelengths than can conveniently pass through the quartz or other windows in conventional excimer lamps. Such gases include He, Ne and Ar. Additionally, other types of radiation, such as x-rays and electron radiation are useful.

Figure 2:
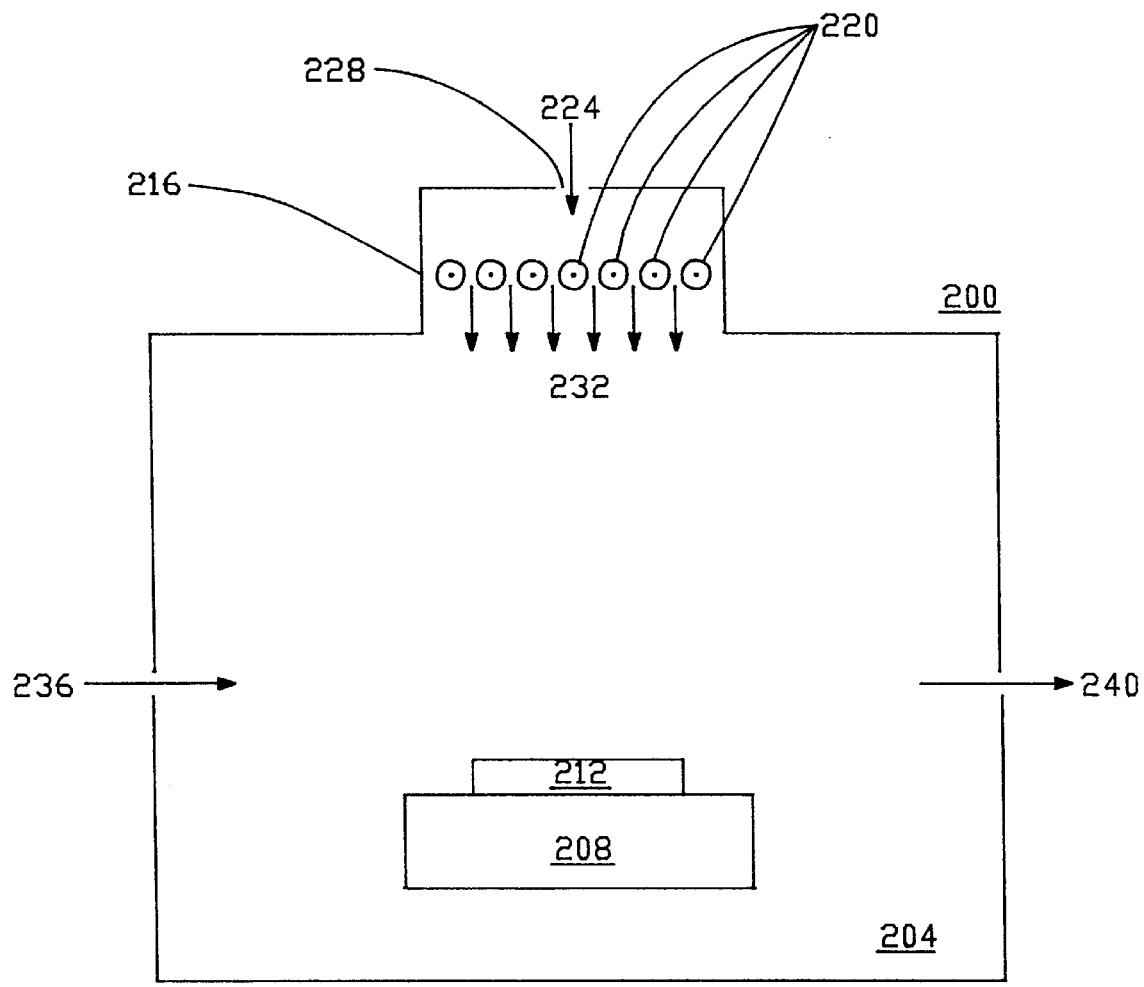
FIG. 2 is a depiction of an embodiment of the invention for exposing semiconductor wafers to electromagnetic radiation derived from an open emitter apparatus.

FIG. 2 depicts a device 200 to treat semiconductor devices with electromagnetic radiation. A chamber 204 houses a chuck 208, which can be heated and is moveable in 3 dimensions. A semiconductor wafer 212 is held on chuck 208, which is positioned under the open emitter device 216. Electrodes 220 are arrayed along one side of the chamber 204. Emitter gas 224 is fed in through a port 228, and flows past electrodes 220. Alternating current in electrodes 220 excites emitter gas 224, and the excited gas enters chamber 204. Wafer 212 is exposed to photons 232, where the pretreatment occurs. Optionally, bias flow for the introduction of other gases is via an inlet port 236. These other gases may be used as emitters, capable of producing wavelengths of radiation different from the first emitter gas. Alternatively, these gases may be used for subsequent conditioning of the wafer while inside the chamber 204. The chamber 204 is evacuated through an exhaust port 240 by a pump (not shown).

The power and exposure times are selected to minimize the surface sensitivity of the USG film deposition. The power output of the emitter lamps is in the range of from about 0.005 W/cm$^2$ to about 100 W/cm$^2$. Preferably, the power output is in the range of from about 0.1 W/cm$^2$ to about 5 W/cm$^2$, and more preferably about 1 W/cm$^2$ Exposure times can vary inversely with the power output of the generator. However, these exposure guidelines can be altered depending upon the pre-existing state of the surface. For cleaner surfaces, less power and/or shorter exposure durations are needed.

Figure 3:
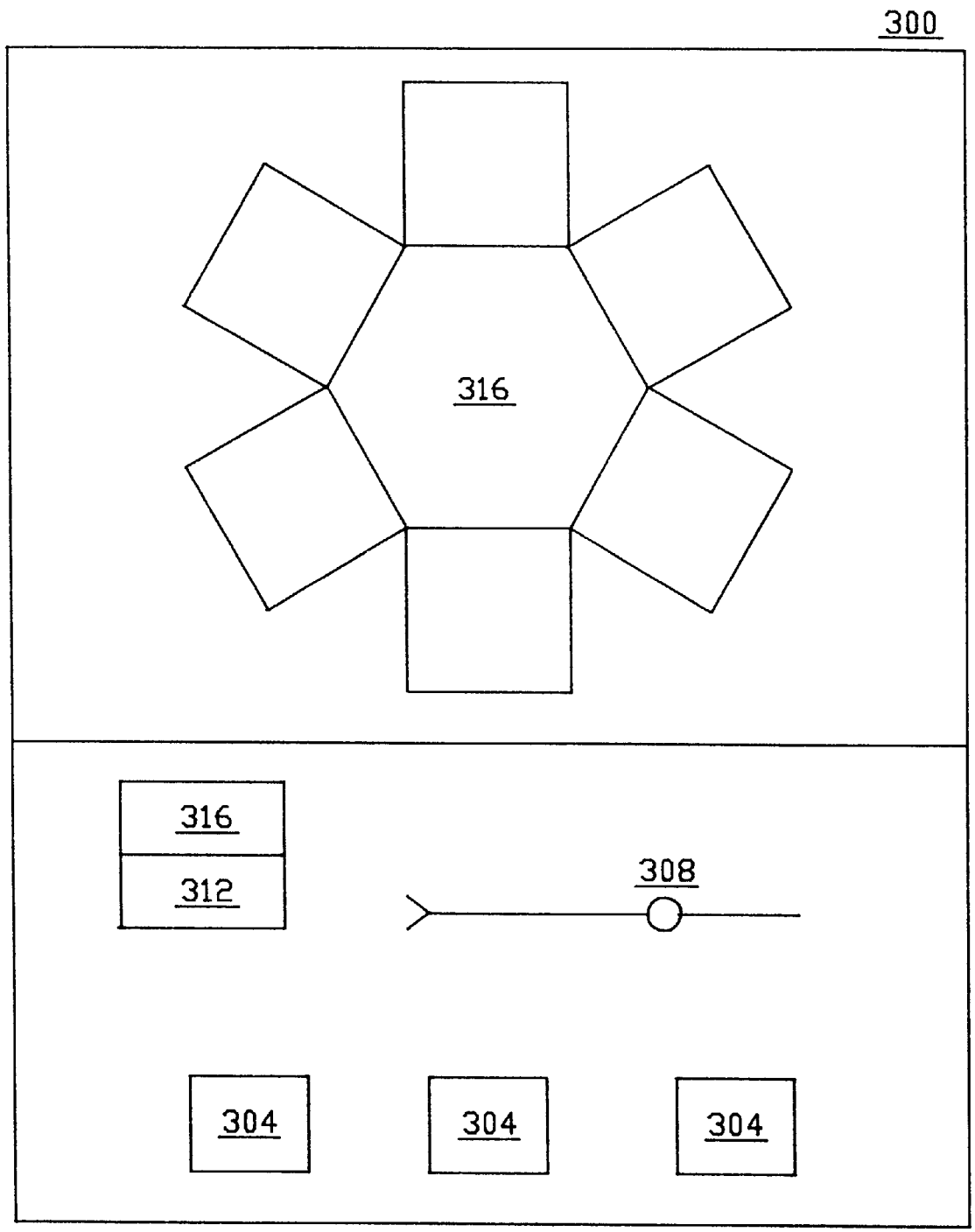
FIG. 3 is a depiction of an embodiment of the invention including a tool for processing semiconductor wafers which includes a structure for exposing wafers to electromagnetic radiation.

FIG. 3 depicts a tool 300 used for pretreatment and deposition of dielectric films of the invention. Wafers to be processed are loaded onto loading stations 304. A robotic arm 308 transfers wafers to a cooling station 312. The pretreatment station 316 contains the electromagnetic radiation emitter devices. Pretreatment station 316 can be similar to the stand alone systems shown in FIG. 1 or FIG. 2. After pretreatment, the robotic arm 308 transfers the wafers to a cluster tool 316 containing multiple deposition stations.

II Pretreatment Of Wafers With Electromagnetic Radiation

Exposing thermal oxide substrate to the electromagnetic radiation as described above results in decreased surface sensitivity. To perform such exposure, wafers are preferably introduced into equipment containing VUV and/or UV light sources. According to at least one theory, the radiation excites the molecular bonds on the surface of the silicon dioxide substrate, and the undesired bonds are broken, enabling contaminating moieties to leave the surface.

The typical process includes three stages. A first conditioning step involves exposing the wafer to various temperatures and gaseous environments. The time of this initial conditioning step is in the range of from about 0 to about 10 minutes, preferably from about 0 seconds to about 30 seconds, and more preferably for about 10 seconds. The temperatures are from about 25° C. to about 700° C., preferably from about 100° C. to about 300° C., and more preferably about 200° C. The chamber pressure is in the range of about 10$^{-5}$ Torr to about 1500 Torr for both the closed and open emitter systems, preferably about 1 Torr to about 100 Torr, and more preferably at about 10 Torr for the closed emitter system. For the open emitter system, preferred pressures are in the range of about 300 Torr to about 900 Torr, and more preferably about 760 Torr. The gases are injected into the reaction chamber, and may be heated, cooled, and/or mixed prior to injection, and may also include vaporized chemicals.

The gases which can be used include inert gases and reactive gases.

Examples of inert gases include He, Ar, Ne, Kr, and Xe. Examples of reactive gases include $NH_3$, chlorofluorocarbons, $Cl_2$ and HCl, $F_2$ and derivatives such as $SF_6$. Additionally, $Br_2$, $O_2$ and its derivatives such as ozone ($O_3$), $H_2$, and gases which can dissociate into Cl, F, Br, O, and S are also useful. Examples of chemicals which may be injected include HF, HCl, $H_2SO_4$, $ClSO_3$, or $H_2O_2$. These materials may be injected alone, or mixed with a carrier has such as nitrogen, hydrogen or oxygen plus any of the inert gases listed above.

The purpose of the inert gases is to generate the excimer radiation. The reactive gases and derivatives of non-reactive gases which, upon exposure to electromagnetic radiation, dissociate and form reactive species, react with the wafer surface to produce a surface with lower surface sensitivity. In the case of the chemicals, their vapors are injected into the reaction region to dissociate under the electromagnetic radiation, thereby forming reactive moieties.

The second stage or processing period involves exposure to the electromagnetic energy, preferably in the form of VUV or UV light. The exposure period is in the range of from about 10 seconds to about 30 minutes, preferably from about 20 seconds to about 50 seconds, and more preferably about 30 seconds. This step may be repeated for up to several times at either the same or different conditions of temperature, pressure, and environmental gas conditions. The radiation used is usually in the range of about 100 nanometers (nm) to about 450 nm, preferably from about 123 nm to about 225 nm, and more preferably about 147 nm to 172 nm. It is also possible to use radiation of shorter wavelengths, which includes x-ray and electron sources which generate radiation with wavelengths below 100 nm.

Any reasonable power density can be used which does not cause excess damage to the electronic devices. The most useful power densities are in the range of about 0.005 W/cm$^2$ to about 100 W/cm$^2$, preferably about 0.1 W/cm$^2$ to about 5 W/cm$^2$, and more preferably about 1 W/cm$^2$.

Post conditioning steps can be used to maintain the desired surface conditions for extended periods of time up to and including about 2 weeks. Post-conditioning processes can be performed using various combinations of temperature, chamber pressure, and gas environment. Any of the above gases or mixtures of gases can be used, preferably including oxygen, nitrogen, and/or ammonia. A gaseous environment permits the attachment of ionic species to the surface of the wafer, rendering it neutral to absorption of contaminants removed during the treatment. For example, ammonia which upon heating to 400° C. for the TEOS ozone deposition, would be released from the surface, exposing the underlying surface with the low surface sensitivity.

III Deposition of Dielectric Materials

Deposition of USG films is accomplished by standard methods in the art. Deposition methods commonly use chemical vapor deposition (CVD) and transport polymerization (TP). Typically, a cap layer of silicon nitride ($Si_3N_4$) may optionally be applied over portions of the thermal oxide layer, prior to depositing a TEOS ozone film. Using these processes, precursors such as TEOS and ozone are reacted together to form reactive intermediate molecules, which can then polymerize to form the USG film. The flow rate of TEOS is in the range of about 0.05 gm/min. to about 1.5 gm/min, and preferably about 0.15 to about 0.4 gm/min. The ozone concentration should be in the range of about greater than 0% to about 18% by volume, preferably in the range of about 5% and 12% by volume. The deposition temperature can be in the range of about 100° C. and about 600° C., and preferably about 400° C. Under these conditions, the rates of deposition of USG on pre-treated thermal oxide are nearly identical to the rates of deposition of USG on bare silicon. Thus, the concentration of ozone which can be used in the deposition of the layer can be increased to over 6 volume % without compromising the rate of deposition of the USG film.

The physical-chemical processes of this invention have desired effects on film manufacture. First, because contaminants are removed from the thermal oxide surface, the rate of deposition of USG films is increased, compared to the deposition on untreated thermal oxide alone. The rates of deposition on untreated thermal oxide are considerably lower than on bare silicon. Rates as low as 500 Å per minute are not uncommon using standard TEOS and ozone concentrations. Radiation pre-treatment increases the rate of TEOS deposition on thermal oxide substrates to rates comparable to those on bare silicon. After radiation pre-treatment, the TEOS deposition rates are often greater than about 2000 Å per minute, and can reach about 5000 Å per minute.

After deposition, the film can be annealed by heating to about 900° C. in nitrogen atmosphere for a few minutes, preferably for about 30 minutes. This annealing step is known to increase the density of the USG layer, reducing the water content of the film, and thereby conferring more desirable dielectric and mechanical properties to the film.

Moreover, the surface pre-treatment results in a much more even distribution of USG. The final surface roughness of the deposited USG film is in the range below about 10 Å, and preferably is between about 2 Å and 8 Å root mean square deviation from planarity.

Furthermore, an ozone film can be deposited, in which the ozone concentration is in the range of from about 0.5 volume % to about 18 volume %, preferably in the range of from about 5 volume % to about 12 volume %. Depositing USG under these ranges of ozone concentration results in films with more desirable surface qualities. Moreover, the increased deposition rates increase the efficiency of gap filling, thus, enabling the production of semiconductor devices with high device density and good electrical insulation.

One possible reason for the improved gap filling is that without pretreatment, the uneven distribution of USG on the gap sidewalls may create barriers to the penetration of reactive intermediates into the gap, thereby decreasing further deposition within the gap. By creating a more even deposition of USG on the sidewall surfaces of the gaps, there will be less opportunity for barriers to form, and therefore, there will be less hindrance to the diffusion of intermediates into the gaps. As the intermediates continue to flow into the gaps, the deposition of the final TEOS ozone film will continue until the gap is completely filled.

Prior methods of filling gaps have focused upon the deposition of a flow-like film within the gap. These prior methods have found that higher temperatures, around 500° C., produce conformal films of high ozone USG. However, as a conformal layer fills a gap, the area in the middle of the gap can be the site of formation of a "weak seam," or an area of poor quality film where the two sides of the conformal film converge. This type of void degrades device performance and may result in trapping of contaminants which can decrease device reliability. Moreover, high temperature deposition results in deposition of particles and increases the consumption of chemicals.

Unexpectedly, we have found that pre-treating the thermal oxide surface with electromagnetic radiation enables the deposition of a flow-like film at low temperatures, which actually fills the gaps better than does a conformal film. The desired gap filling properties of the high ozone USG films are obtainable using the UV/VUV pretreatment process of this invention at temperatures of about 400° C. The advantage of this invention over the prior art is that with flow-like deposition, there is no weak seam in the middle of the gap, and therefore, there is less degradation of device performance and increased device reliability. Moreover, particle deposition is minimized, as is the consumption of chemicals by depositing at 400° C.

This is only one possible theory to account for the improved gap filling of the present invention, and we do not rely upon this or any other particular theory of operability. Other theories may account for the observations, and all are considered to be part of this invention.

EXAMPLES

The following Examples demonstrate the effects of pre-treating semiconductor a substrate with electromagnetic radiation on the deposition rate, surface roughness, and gap filling properties of subsequently deposited TEOS ozone films.

Example 1
Effect of VUV Pretreatment on Rate of Deposition of USG Films

To determine the effect of VUV pretreatment on the rate of deposition of USG films, experiments were conducted on silicon and thermal oxide wafers. Control wafers had a USG film deposited on bare silicon. Other wafers were of untreated thermal oxide, and still other wafers were exposed to VUV radiation of 172 nm using a Xe excimer lamp as depicted in FIG. 1. The power density was 15 W/cm$^2$, the temperature was room temperature, the lamp distance from the wafer was 4 cm, the exposure time was either 1 minute or 5 minutes, and the chamber pressure was 0.2 millibar.

After exposure, films of USG were deposited using a thermal chemical vapor deposition (CVD) process. In the absence of pretreatment, the rate of deposition and the film properties were dependent upon the concentration of ozone in the deposition process. At very low ozone concentrations (below about 0.1%), the rate of deposition of USG films is very low. At ozone concentrations above about 0.25%, the rate of deposition increases rapidly. Above ozone concentrations at about 0.5%, the rate increases further, but more slowly. The maximal rate of deposition occurs at about 1–2% ozone, and further increases in ozone concentration actually decrease deposition rates. Moreover, at higher ozone concentrations, deposition rates on untreated thermal oxide were progressively less than the rates on bare silicon.

However, pretreatment with VUV radiation increased the deposition rate of USG films on thermal oxide substrates. Table 4 shows the results of studies in which we compared the deposition rates of TEOS ozone films on either bare silicon substrate, or thermal oxide substrates either with or without VUV pre-treatment. The TEOS flow rate was 0.4 gm/min, the ozone concentration was 120 gm/m$^3$, the deposition temperature was 400° C., and the deposition time was 5 minutes.

TABLE 4

Effect Of VUV Radiation On SiO$_2$ Deposition On Thermal Oxide

| Substrate | Treatment | Growth Rate (Å/min) | Ratio of Growth on SiO$_2$/Si (%) |
|---|---|---|---|
| Si | None | 946 | 100 |
| Thermal Oxide | None | 786 | 83 |
| Thermal Oxide | 172 nm, 1 min | 913 | 97 |
| Thermal Oxide | 172 mn, 5 min | 935 | 99 |

Table 4 shows that thermal oxide decreases the rate of TEOS ozone film deposition by 17% compared to bare silicon. However, VUV pretreatment for as short a time as 1 minute substantially increased the growth rate of TEOS ozone films on thermal oxide compared to untreated thermal oxide substrate. After 1 minute of pre-treatment, the deposition rate was 97% of that observed for silicon. Additional pre-treatment increased the deposition rates further, with treatment for 5 minutes resulting in 99% of the growth rate on thermal oxide compared to silicon. Thus, we conclude that VUV pre-treatment substantially increases the rate of deposition of TEOS ozone films on thermal oxide substrates.

Example 2
Effect of VUV Pretreatment on Smoothness of USG Films

To determine the effect of pre-treating substrate on the smoothness of TEOS ozone film, we performed experiments on bare silicon substrates or on thermal oxide substrates with and without pretreatment with VUV radiation. FIGS. 4a–d shows the effect of VUV treatment on the smoothness of the surface of a TEOS ozone film after deposition.

Exposure was accomplished using a Xe excimer lamp as shown in FIG. 1. The power density was 15 W/cm$^2$, the temperature was room temperature, the lamp distance from the wafer was 4 cm, the exposure time was either 1 minute or 5 minutes, and the chamber pressure was 0.2 millibar.

FIG. 4a shows a scanning electron micrograph of a TEOS ozone film deposited as in Example 1. The TEOS flow rate was 0.4 gm/min., the ozone concentration was 120 gm/m$^3$, the deposition temperature was 400° C., and the deposition time was 5 minutes. The surface appears smooth, with minimal surface roughness, In contrast, a TEOS ozone film deposited under the identical conditions, except that the substrate was thermal oxide (FIG. 4b), shows a granular appearance and much greater surface roughness than was observed for the bare silicon substrate (FIG. 4a).

Pretreatment of an otherwise identical thermal oxide substrate with 1 minute of VUV in vacuum (FIG. 4c), resulted in the surface roughness of the TEOS ozone film being substantially reduced compared to the TEOS ozone film deposited on untreated thermal oxide. This smoother surface provides the advantage of decreasing reflections of the stepper light radiation, and thereby results in higher dimensional definition of the photoresist layer. Moreover, during etching, the reduced speckling of the surface reduces the adhesion with the possibility of delamination.

Furthermore, increasing the duration of VUV treatment (FIG. 4d) further decreased the surface roughness of the TEOS ozone film. In fact, the surface of the 5 minute treated substrate appeared nearly identical to that of TEOS ozone deposited on bare silicon (FIG. 4a).

Therefore, we conclude that VUV pretreatment substantially decreases the surface sensitivity of TEOS ozone based silicate glass films.

Example 3
Effects of VUV Pre-Treatment On TEOS Ozone Gap Filling

To determine whether the gap filling by TEOS ozone films was satisfactory after VUV pretreatment, we studied shallow trench isolation (STI) patterned wafers with 0.25 μm gaps. A thin layer of thermal oxide was created on top the silicon wafer, and the tops of the trenches were capped with layers of silicon nitride. The wafers were then pretreated with VUV as in Example 1, and then were subjected to TEOS ozone oxide deposition using chemical vapor deposition. The ozone concentration was 120 gm/m$^3$, the deposition temperature was 400° C., the TEOS flow rate was 0.18 gm/min, standard liters/min, the film growth rate was 500 Å/min., and the deposition time was 10 minutes. The film was then annealed at 900° C. for 30 minutes under N$_2$ atmosphere. The wafer was then cracked and prepared for scanning electron micrography using a 6:1 buffered oxide etch (ROE) for 8 seconds.

FIGS. 5a–b depict the different layers of a semiconductor wafer device 500. FIG. 5a depicts the silicon substrate 504 with patterned trenches, and a layer of thermal oxide 508 deposited evenly over the entire surface of the wafer, including the bottoms and sidewalls of the trenches. Caps of silicon nitride 512 cover the tops of the trenches. FIG. 5b depicts a similar wafer which has been pre-treated with electromagnetic radiation and subsequently had a layer of high TEOS ozone film 516 deposited over the entire surface of the wafer.

FIG. 6 is a scanning electron micrograph of a STI wafer treated as described above for FIG. 5. As is apparent, the gaps are completely filled with TEOS ozone, with no visible defects in the gaps. Furthermore, the surface of the film appears smooth, with no visible surface roughness.

The VUV radiation pre-treatment increases the deposition rate of the USG film, permitting film growth more rapidly than otherwise would be obtained. As the film grows more rapidly in the gap, there is less tendency for the film to form "breadloaf" shapes over the features, and extending in between the tops of the top gaps, which would prevent reactive intermediates from having access to the interior of the gaps.

The foregoing examples and description are intended to be illustrative only, and are not intended to be limiting to the scope of the invention. Further understanding of the scope of the invention can be found by referring to the Figures and the Claims.

What is claimed is:

1. A method for preparing the surface of a semiconductor wafer to reduce surface sensitivity, comprising:
   providing a semiconductor substrate, wherein the surface of said substrate has a layer of dielectric material thereon; and
   exposing the surface of the wafer to electromagnetic radiation having a wavelength between about 60 nanometers and about 550 nanometers sufficient to reduce the surface sensitivity of said semiconductor surface.

2. The method of claim 1, wherein the dielectric material is selected from the group consisting of thermal oxide, silicon dioxide deposited by plasma enhanced chemical vapor deposition, silicon dioxide deposited by high density plasma enhanced chemical vapor deposition, phosphorous silicate glass, borophosphorous glass, spin on glass, and silicon nitride.

3. A method for preparing the surface of a semiconductor wafer to reduce surface sensitivity, comprising:
   providing a semiconductor substrate, wherein the surface of said substrate has contaminants thereon; and
   exposing the surface of the wafer to electromagnetic radiation having a wavelength between about 60 nanometers and about 550 nanometers sufficient to remove contaminants from said semiconductor surface.

4. The method of claim 3, wherein the contaminants comprise at least one of excess H$_2$O, carbon-containing molecules, Si—OH bonds, Si—F bonds, and Si—O—Si bonds.

5. The method of claim 1, wherein the electromagnetic radiation is in the range of vacuum ultraviolet wavelengths.

6. The method of claims 1 or 3, wherein the electromagnetic radiation comprises wavelengths in the range of about vacuum ultraviolet to about ultraviolet wavelengths.

7. A method for preparing a semiconductor wafer, comprising:
   providing a semiconductor wafer, wherein the surface of said substrate has contaminants thereon;
   placing said wafer in a chamber;
   evacuating said chamber;
   introducing a moiety capable of emitting electromagnetic radiation of at least one of vacuum ultraviolet wavelengths and ultraviolet wavelengths into said chamber; and
   exposing said moiety to an electric field sufficient to generate at least one of vacuum ultraviolet and ultraviolet radiation from said moiety; thereby exposing the wafer to said radiation.

8. A method for preparing the surface of a semiconductor wafer, comprising:
   providing a semiconductor substrate, wherein the surface of said substrate has a layer of dielectric material thereon; and
   exposing the surface of the wafer to electromagnetic radiation having a wavelength between about 60 nanometers and about 550 nanometers and having an intensity in the range of about 0.005 Watts/cm$^2$ to about 100 Watts/cm$^2$.

9. The method of claim 1, wherein the electromagnetic radiation is derived from an excimer device.

10. The method of claim 1, wherein the electromagnetic radiation is derived from a dielectric barrier discharge apparatus.

11. The method of claim 9, wherein the excimer apparatus uses a noble gas.

12. A method for preparing a semiconductor wafer to reduce surface sensitivity, comprising:
   providing a semiconductor substrate, wherein the surface of said substrate has contaminants thereon;
   placing said wafer on a chuck in a chamber which does not contain a gas capable of absorbing electromagnetic radiation; and
   exposing said wafer to electromagnetic radiation having a wavelength in the range of about 60 nm to about 550 nm derived from one of an excimer lamp, a dielectric barrier discharge apparatus and a open excimer apparatus for sufficient time to substantially remove the contaminants from said surface.

13. A method for preparing a semiconductor wafer, comprising:
   providing a semiconductor wafer, wherein the surface of said substrate has contaminants thereon;
   placing said wafer in a chamber;
   evacuating said chamber;
   introducing a moiety capable of emitting electromagnetic radiation of at least one of vacuum ultraviolet wavelengths and ultraviolet wavelengths into said chamber; and exposing said moiety to an electric field sufficient to generate at least one of vacuum ultraviolet and ultraviolet radiation from said moiety; and exposing said wafer to the at least one of the vacuum ultraviolet radiation and ultraviolet radiation for sufficient time to substantially remove the contaminants from the surface of said semiconductor substrate.

14. The method of claim 13, wherein the moiety is selected from the group consisting of helium, neon, krypton, KrF, KrCl, mercury, selenium, XeF, XeCl, argon/fluorine, mercury/argon, deuterium, nitrogen, argon, xenon, oxygen, and ammonia.

15. An apparatus for preparing the surface of a semiconductor wafer, comprising:

a chamber;

a heated chuck in said chamber for holding a semiconductor wafer, wherein said chuck is moveable in three dimensions;

a source for providing at least one of vacuum ultraviolet radiation and ultraviolet radiation within said chamber over said chuck;

an inlet port for introducing gas into the chamber;

an exhaust port for evacuating the chamber; and a pump to decrease the pressure in said chamber.

16. The apparatus of claim 15, further comprising a reflector for directing the radiation to the wafer.

17. An apparatus for preparing the surface of a semiconductor wafer, comprising:

a chamber;

a heated chuck capable of being moved in three dimensions in said chamber for holding a semiconductor wafer; and a source for providing vacuum ultraviolet radiation within said chamber over said chuck.

18. The apparatus of claim 17, further comprising a source for providing ultraviolet radiation within said chamber relative to said chuck.

19. The apparatus of claim 17, wherein the source of the vacuum ultraviolet radiation is derived from dielectric barrier discharge.

20. The apparatus of claim 17, wherein the source of the vacuum ultraviolet radiation is an excimer apparatus.

21. A semiconductor wafer, wherein the surface of said semiconductor wafer comprises a layer of dielectric material, and wherein said surface of said semiconductor wafer has been prepared by exposing said surface to electromagnetic radiation having a wavelength between about 60 nanometers and about 550 nanometers sufficient to reduce the surface sensitivity.

22. The semiconductor wafer of claim 21, wherein the dielectric material is selected from the group consisting of thermal oxide, silicon dioxide deposited by plasma enhanced chemical vapor deposition, silicon dioxide deposited by high density plasma enhanced chemical vapor deposition, phosphorous silicate glass, borophosphorous glass, spin on glass, and silicon nitride.

23. A semiconductor wafer, wherein the surface of said semiconductor wafer has been prepared by exposing said surface in a chamber which does not contain a gas capable of absorbing electromagnetic radiation to electromagnetic radiation having a wavelength in the range of about 60 nm to about 550 nm sufficient to remove contaminants from said surface to reduce surface sensitivity.

24. A method for manufacturing a layer of undoped silicate glass on the surface of a semiconductor wafer, comprising:

providing a semiconductor wafer, wherein the surface of said wafer comprises a layer of dielectric material;

exposing the surface of said wafer to at least one of vacuum ultraviolet radiation and ultraviolet radiation sufficient to reduce surface sensitivity; and depositing on said surface, a layer of undoped silicate glass.

25. The method of claim 24, wherein the dielectric material is selected from the group consisting of thermal oxide, silicon dioxide deposited by plasma enhanced chemical vapor deposition, silicon dioxide deposited by high density plasma enhanced chemical vapor deposition, phosphorous silicate glass, borophosphorous glass, spin on glass, and silicon nitride.

26. A method for manufacturing a layer of undoped silicate glass on the surface of a semiconductor wafer, comprising:

providing a semiconductor wafer, wherein the surface of said wafer has contaminants thereon;

exposing the surface of the wafer to at least one of vacuum ultraviolet radiation and ultraviolet radiation sufficient to remove contaminants from said surface; and depositing on said surface, a layer of undoped silicate glass.

27. The method of either claim 24 or claim 26, wherein the undoped silicate glass is manufactured using tetraethylorthosilicate and ozone in one of a transport polymerization and chemical vapor deposition process.

28. The method of claim 27, wherein the percentage of ozone to oxygen is between about 0 and about 18% by volume.

29. The method of claim 27, wherein the percentage of ozone to oxygen is between about 0.5 and 8% by volume.

30. The method of claim 27, wherein the percentage of ozone to oxygen is between about 1% and 5% by volume.

31. The method of claim 27, wherein the flow rate of tetraethylorthosilicate is from about 0.05 gm/minute to about 1.5 gm/minute.

32. The method of claim 27, wherein the flow rate of tetraethylorthosilicate is about 0.18 gm/min.

33. The method of claim 27, wherein the thermal chemical vapor deposition process is carried out at a temperature between about 100° C. and about 600° C.

34. The method of claim 27, wherein the thermal chemical vapor deposition process is carried out at a temperature of about 400° C.

35. The method of claim 26, wherein the layer of undoped silicate glass is conformal.

36. A method for reducing the surface sensitivity of a semiconductor wafer, comprising:

providing a semiconductor substrate comprising dielectric material; and exposing the surface of the wafer to electromagnetic radiation sufficient to permit subsequent deposition of an undoped silicate glass layer.

37. The method of claim 36, wherein the dielectric material is selected from the group consisting of thermal oxide, silicon dioxide deposited by plasma enhanced chemical vapor deposition, silicon dioxide deposited by high density plasma enhanced chemical vapor deposition, phosphorous silicate glass, borophosphorous glass, spin on glass, and silicon nitride.

38. The method of claim 36, wherein the undoped silicate glass layer has a root mean square deviation from planarity is no greater than about 10 Å.

39. The method of claim 36, wherein the undoped silicate glass layer is a TEOS ozone based oxide layer.

40. The method of claim 36, wherein the root mean square of the deviation from planarity is between about 2 and about 8 Å.

41. A method for manufacturing an integrated circuit, comprising:
   providing semiconductor device structures on a semiconductor substrate;
   providing conducting lines overlying said semiconductor device structures wherein a gap is formed between said conducting lines;
   providing a dielectric layer on the surfaces of said substrate wherein said gap remains between said conducting lines;
   treating said dielectric layer with electromagnetic radiation to decrease the surface sensitivity of said dielectric layer; and
   filling said gap with undoped silicate glass.

42. The method of claim 41, wherein the dielectric layer is a material selected from the group consisting of thermal oxide, silicon dioxide deposited by plasma enhanced chemical vapor deposition, silicon dioxide deposited by high density plasma enhanced chemical vapor deposition, phosphorous silicate glass, borophosphorous glass, spin on glass, and silicon nitride.

43. The method of claim 26 wherein the rate of deposition of undoped silicate glass film on thermal oxide is between about 500 Å per minute and 5000 Å per minute.

44. The method of claim 26 wherein the rate of deposition of undoped silicate glass film on thermal oxide is between about 1000 Å per minute and about 2000 Å per minute.

45. The method of claim 26 wherein the rate of deposition of undoped silicate glass film on thermal oxide is about 1500 Å per minute.

46. A method of post-conditioning a pre-treated dielectric layer comprising;
   providing a pre-treated dielectric layer; and
   exposing said pre-treated dielectric layer using a moiety which protects said pre-treated dielectric layer from contamination.

47. The method of claim 46, wherein said moiety is selected from the group consisting of ammonia, chlorine, HCl, $F_2$, $SF_6$, a chlorofluorocarbon, $Br_2$, $O_2$, $H_2$, HF, $H_2SO_4$, $ClSO_3$, and $H_2O_2$.

48. A method for preparing a semiconductor wafer, comprising:
   placing said wafer in a chamber having a moiety capable of emitting electromagnetic radiation of at least one of vacuum ultraviolet wavelengths and ultraviolet wavelengths into said chamber; and
   exposing said moiety to an electric field sufficient to generate at least one of vacuum ultraviolet and ultraviolet radiation from said moiety; thereby exposing the wafer to said radiation.

49. The method of claim 48, wherein the step of placing said wafer in said chamber comprises using a lock loader.

50. The method of claim 12, wherein said chuck is moveable in three dimensions.

51. A method for preparing the surface of a semiconductor wafer with a layer of dielectric material, comprising exposing the surface of the wafer to electromagnetic radiation having a wavelength between about 60 nanometers and about 550 nanometers sufficient to reduce the surface sensitivity of said semiconductor surface.

52. A method for preparing the surface of a semiconductor wafer to reduce surface sensitivity, comprising exposing the surface of the wafer to electromagnetic radiation having a wavelength between about 60 nanometers and about 550 nanometers sufficient to remove contaminants from said semiconductor surface.

53. A method for preparing a semiconductor wafer to reduce surface sensitivity, comprising:
   placing said wafer on a chuck in a chamber which does not contain a gas capable of absorbing electromagnetic radiation; and
   exposing said wafer to electromagnetic radiation having a wavelength in the range of about 60 nm to about 550 nm derived from one of an excimer lamp, a dielectric barrier discharge apparatus and a open excimer apparatus for sufficient time to substantially remove contaminants from said surface.

54. An apparatus for preparing the surface of a semiconductor wafer, comprising:
   a chamber;
   a chuck in said chamber for holding a semiconductor wafer;
   a source for providing at least one of vacuum ultraviolet radiation and ultraviolet radiation within said chamber relative to said chuck;
   an inlet port for introducing gas into the chamber;
   an exhaust port for evacuating the chamber; and
   a pump to decrease the pressure in said chamber.

55. A semiconductor wafer having a surface prepared by exposing said surface to electromagnetic radiation having a wavelength between about 60 nanometers and about 550 nanometers sufficient to reduce the surface sensitivity.

56. A method for reducing the surface sensitivity of a semiconductor wafer, comprising exposing a surface of the wafer to electromagnetic radiation sufficient to permit subsequent deposition of an undoped silicate glass layer.

57. A method for reducing the surface sensitivity of a semiconductor wafer having a dielectric material, comprising exposing a surface of the wafer to electromagnetic radiation sufficient to permit subsequent deposition of an undoped silicate glass layer.

58. The apparatus of claim 15, wherein the source of the vacuum ultraviolet radiation is derived from dielectric barrier discharge.

59. The apparatus of claim 15, wherein the source of the vacuum ultraviolet radiation is an excimer apparatus.

60. An apparatus for preparing the surface of a semiconductor wafer, comprising:
   a chamber;
   a heated chuck in said chamber for holding a semiconductor wafer, wherein said chuck is moveable in three dimensions;
   a source for providing at least one of vacuum ultraviolet radiation and ultraviolet radiation within said chamber relative to said chuck;
   an inlet port for introducing gas into the chamber;
   an exhaust port for evacuating the chamber; and
   a pump to decrease the pressure in said chamber.

61. An apparatus for preparing the surface of a semiconductor wafer, comprising:
   a chamber;
   a chuck in said chamber for holding a semiconductor wafer;
   a source for providing vacuum ultraviolet radiation radiation within said chamber relative to said chuck;
   an inlet port for introducing gas into the chamber;
   an exhaust port for evacuating the chamber; and
   a pump to decrease the pressure in said chamber.

* * * * *